(12) United States Patent
Park

(10) Patent No.: US 8,466,040 B2
(45) Date of Patent: Jun. 18, 2013

(54) METHOD OF MANUFACTURING SEMICONDUCTOR DEVICE

(75) Inventor: Byungjun Park, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 138 days.

(21) Appl. No.: 12/654,187

(22) Filed: Dec. 14, 2009

(65) Prior Publication Data

US 2010/0197071 A1   Aug. 5, 2010

(30) Foreign Application Priority Data

Jan. 30, 2009   (KR) .................. 10-2009-0007663

(51) Int. Cl.
*H01L 21/301* (2006.01)
*H01L 21/461* (2006.01)
*H01L 31/0232* (2006.01)

(52) U.S. Cl.
USPC ............. 438/459; 438/67; 438/458; 438/462

(58) Field of Classification Search
None
See application file for complete search history.

(56) References Cited

U.S. PATENT DOCUMENTS

| 7,060,592 B2 * | 6/2006 | Pan et al. ............... 438/458 |
| 2007/0072393 A1 * | 3/2007 | Aspar et al. .............. 438/459 |
| 2008/0087921 A1 * | 4/2008 | Yu et al. ................. 257/213 |

FOREIGN PATENT DOCUMENTS

| JP | 2000-173961 | 6/2000 |
| JP | 2001-144274 | 5/2001 |
| JP | 2006-339302 | 12/2006 |
| KR | 10-2008-0012921 | 2/2008 |

* cited by examiner

*Primary Examiner* — Zandra Smith
*Assistant Examiner* — Pamela E Perkins
(74) *Attorney, Agent, or Firm* — Harness, Dickey & Pierce, P.L.C.

(57) ABSTRACT

The method may include providing a first substrate, the first substrate including a sacrificial layer, an active layer having an image sensor circuit portion and an interconnection layer electrically connected to the image sensor circuit portion sequentially stacked; performing an edge-trimming process with respect to the first substrate to form an interconnection layer pattern, an active layer pattern and a sacrificial layer pattern; adhering the first substrate to a second substrate; removing the sacrificial layer pattern to expose the active layer pattern; and forming a transillumination layer to provide light to an image sensor portion on the active layer pattern.

15 Claims, 17 Drawing Sheets

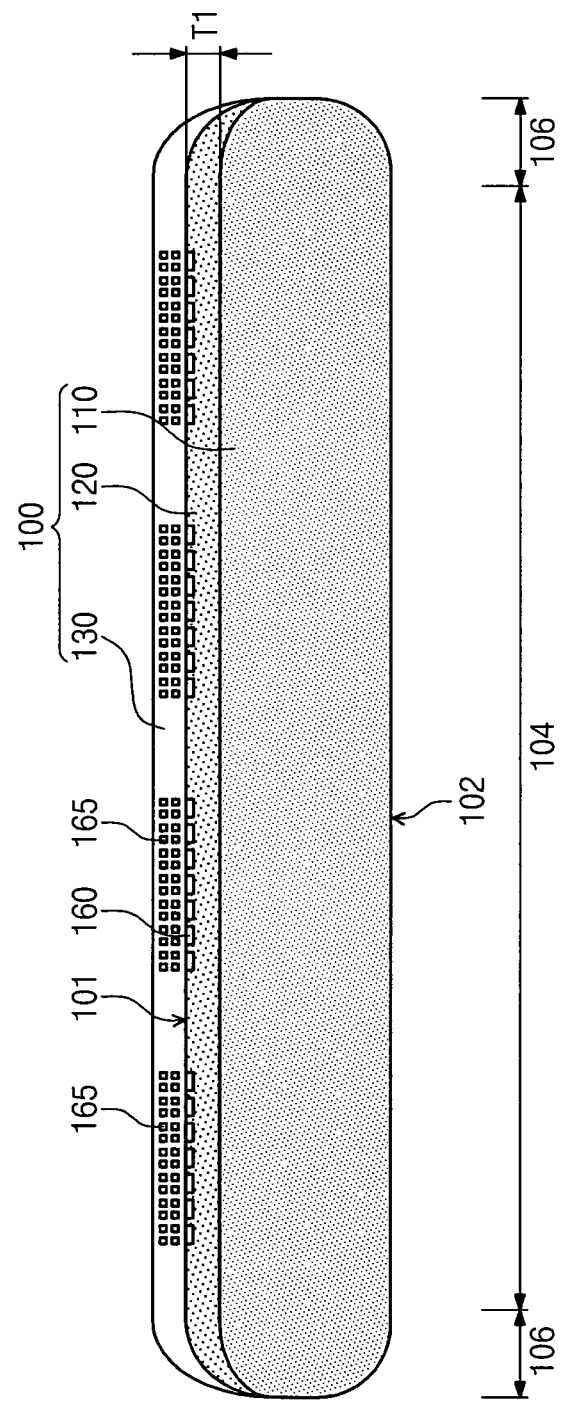

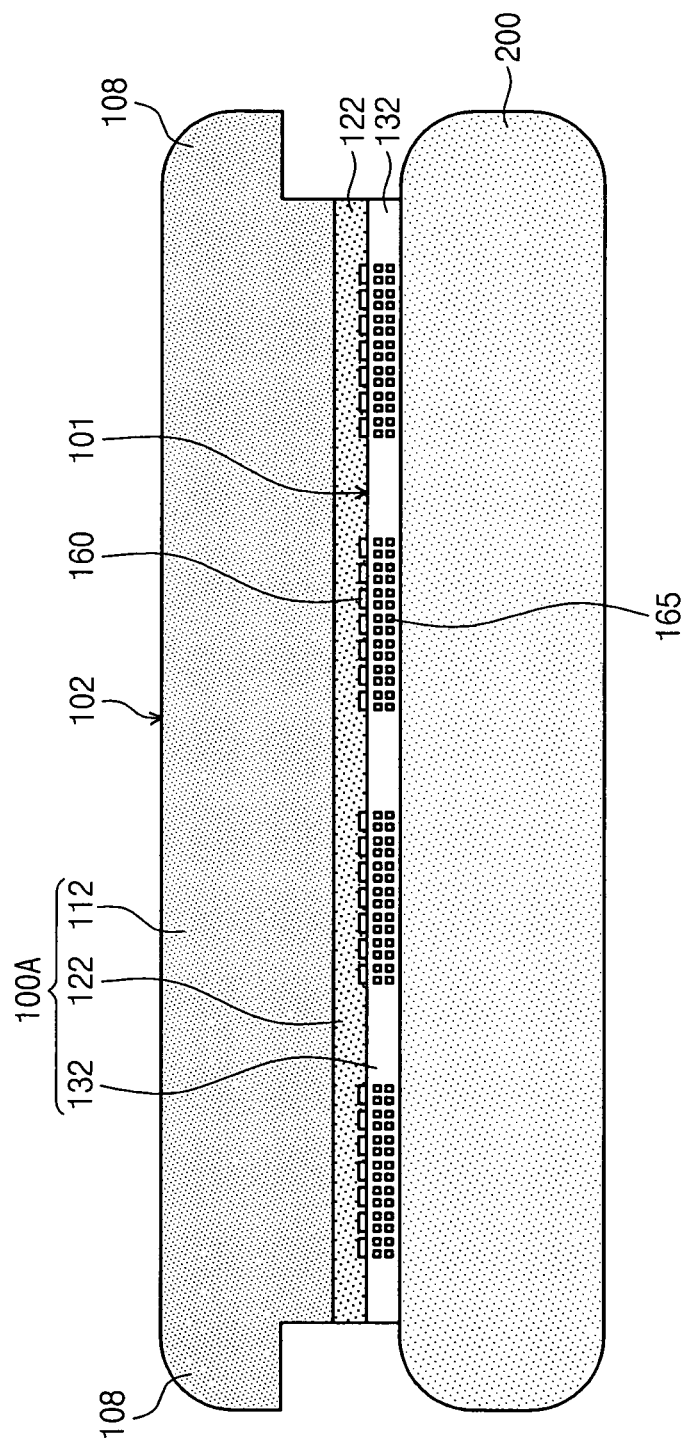

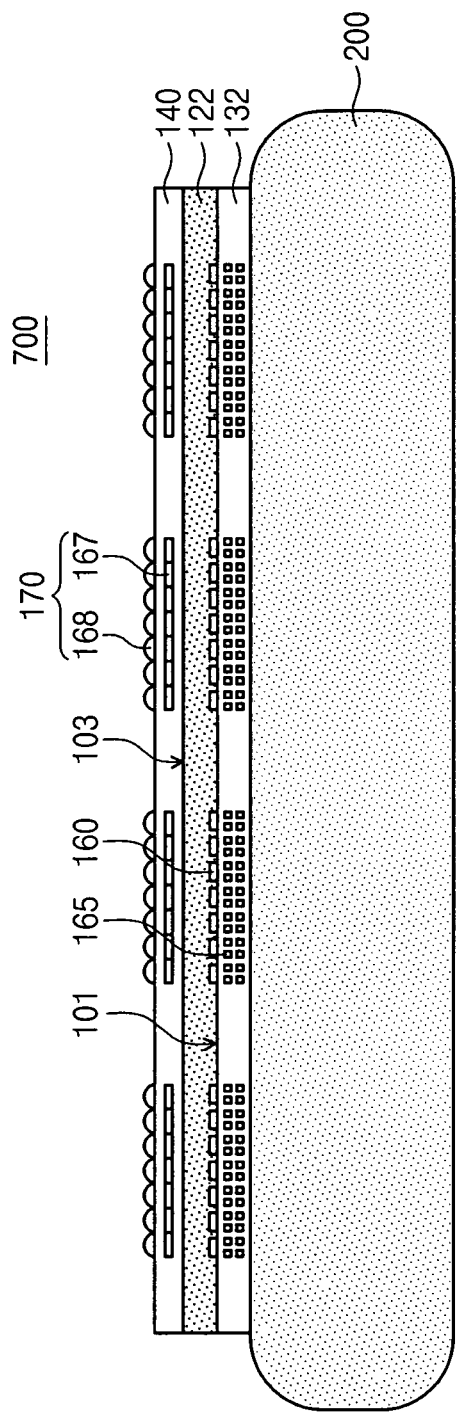

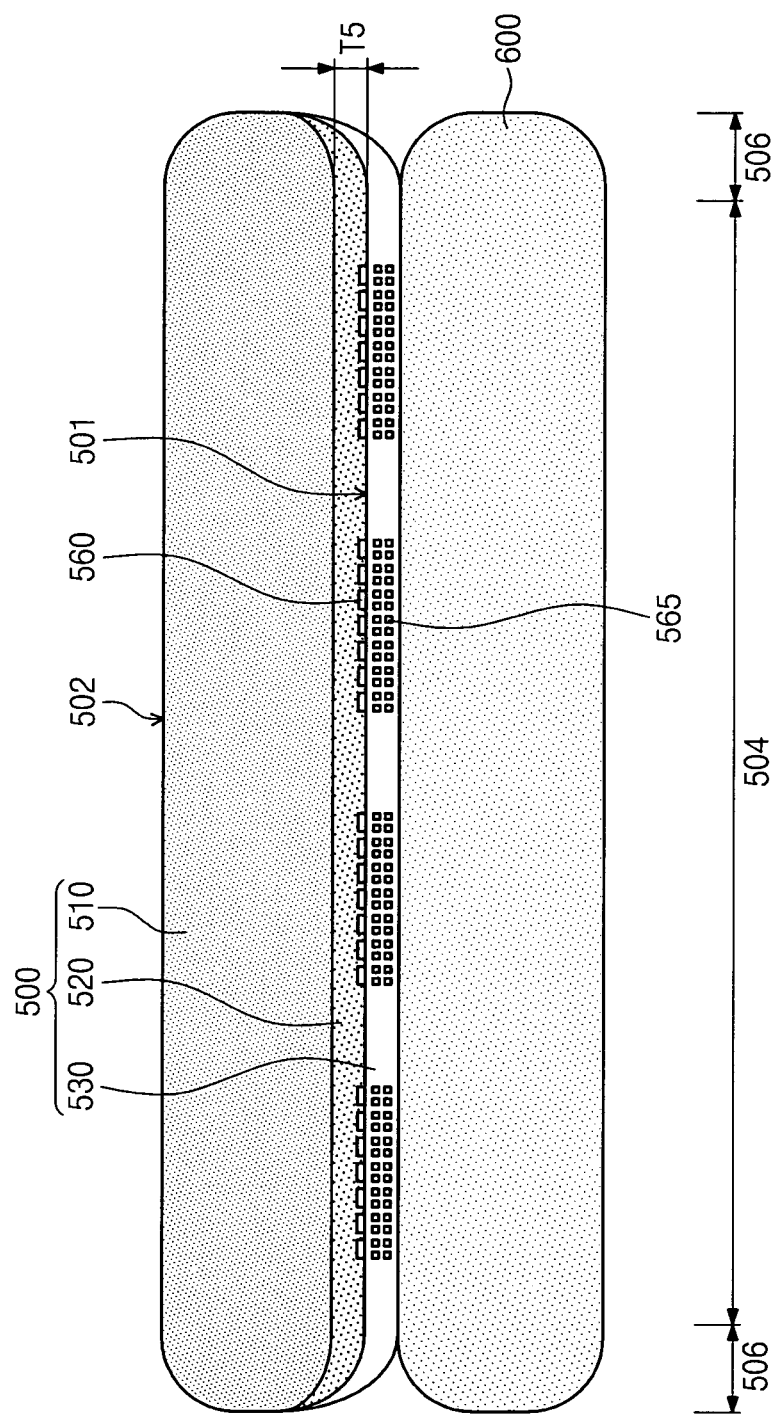

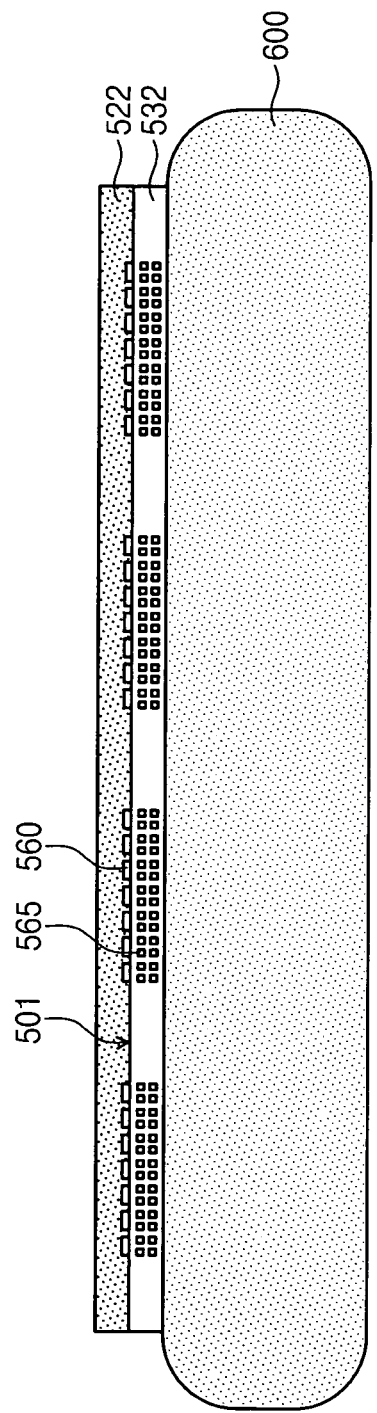

ABSTRACT
METHOD OF MANUFACTURING SEMICONDUCTOR DEVICE

PRIORITY STATEMENT

This U.S. non-provisional patent application claims priority under 35 U.S.C. §119 to Korean Patent Application No. 10-2009-0007663, filed on Jan. 30, 2009, in the Korean Intellectual Property Office (KIPO), the entire contents of which are incorporated herein by reference.

BACKGROUND

1. Field

Example embodiments of the inventive concept herein relate to methods of manufacturing semiconductor devices, and more particularly, to methods of manufacturing image sensors.

2. Description of the Related Art

An image sensor converts an optical image into an electrical signal. An image sensor may include a charge coupled device (CCD) and a CMOS image sensor. An image sensor may include a photodetector having a silicon substrate where a photodiode is formed, interconnection lines that are sequentially stacked on one surface of the silicon substrate, a color filter layer and a microlens.

The amount of incident light entering a photodetector of an image sensor may be reduced by interconnection lines. A backside illuminated CMOS image sensor (BI CIS) is being developed to reduce the amount of incident light entering a photodetector. The backside illuminated CMOS image sensor (BI CIS) may include an interconnection layer including interconnection lines disposed on one surface of a substrate, and a color filter layer and a microlens disposed on the other surface of the substrate.

SUMMARY

The inventive concept provides a method of manufacturing a semiconductor device, including providing a first substrate, the first substrate including a sacrificial layer, an active layer having an image sensor circuit portion and an interconnection layer electrically connected to the image sensor circuit portion sequentially stacked; performing an edge-trimming process with respect to the first substrate to form an interconnection layer pattern, an active layer pattern and a sacrificial layer pattern; adhering the first substrate to a second substrate; removing the sacrificial layer pattern to expose the active layer pattern; and forming a transillumination layer on the active layer pattern, the transillumination layer configured to transmit light to the image sensor portion.

The first substrate may be adhered to the second substrate after performing the edge-trimming process. Performing the edge-trimming with respect to the first substrate may include sequentially performing a dry etching process with respect to an edge of the interconnection layer and an edge of the active layer to form the interconnection layer pattern and the active layer pattern; and performing a dry etching process with respect to a portion of an edge of the sacrificial layer to form the sacrificial layer pattern. Adhering the first substrate to the second substrate may include adhering the interconnection layer pattern to the second substrate. The edge-trimming process may be performed after adhering the first substrate to the second substrate.

Adhering the first substrate to the second substrate may include adhering the interconnection layer to the second substrate. Performing an edge-trimming process with respect to the first substrate may include removing an edge of the sacrificial layer by dry etching to form the sacrificial layer pattern; and sequentially removing an edge of the active layer and an edge of the interconnection layer by the dry etching to form the active layer pattern and the interconnection layer pattern. Performing an edge-trimming process with respect to the first substrate may include removing a portion of the first substrate by dry etching using one of an anisotropic etching, a laser beam and a blade.

Removing the sacrificial layer pattern may include polishing an entire portion of the sacrificial layer pattern until the active layer pattern may be exposed. Alternatively, the removing of the sacrificial layer pattern may include polishing a portion of the sacrificial layer pattern, and performing a wet etching process with respect to the other portion of sacrificial layer pattern until the active layer pattern may be exposed. Forming the transillumination layer may include forming a color filter layer on the active layer pattern: and forming a microlens on the color filter layer.

The sacrificial layer may be a silicon substrate. The method may further include forming the active layer on the sacrificial layer, the active layer being made of single crystalline silicon using an epitaxial technique. The method may further include forming the active layer on the sacrificial layer, the active layer and the sacrificial layer including a level portion and an edge portion connected to the level portion, the level portion including a first surface and a second surface facing each other. The method may further include forming the active layer on the sacrificial layer to have a first depth in a vertical direction from the first surface, and forming an image sensor circuit portion in the first depth. Forming the image sensor circuit portion may include electrically connecting a transistor to a photodetector. The method may further include forming the interconnection layer on the active layer by forming an interconnection inside of the interconnection layer, and electrically connecting the interconnection to the image sensor circuit portion.

The interconnection layer pattern, the active layer pattern and the sacrificial layer pattern may include a third surface perpendicular to the first surface. The active layer pattern and the sacrificial layer may constitute a portion of the third surface and may include a side having a second depth greater than the first depth. The second depth may be 4 μm to 100 μm.

BRIEF DESCRIPTION OF THE DRAWINGS

Example embodiments will be more clearly understood from the following detailed description taken in conjunction with the accompanying drawings. FIGS. 1A-5 represent non-limiting, example embodiments as described herein.

FIGS. 1A through 1E are cross section views illustrating a method of manufacturing a semiconductor device in accordance with an example embodiment of the inventive concept;

FIGS. 4A through 4D are cross section views illustrating a method of manufacturing a semiconductor device in accordance with an example embodiment of the inventive concept; and FIG. 5 is a perspective view illustrating an electronic device including a semiconductor device in accordance with example embodiments of the inventive concept.

Figure 1B:
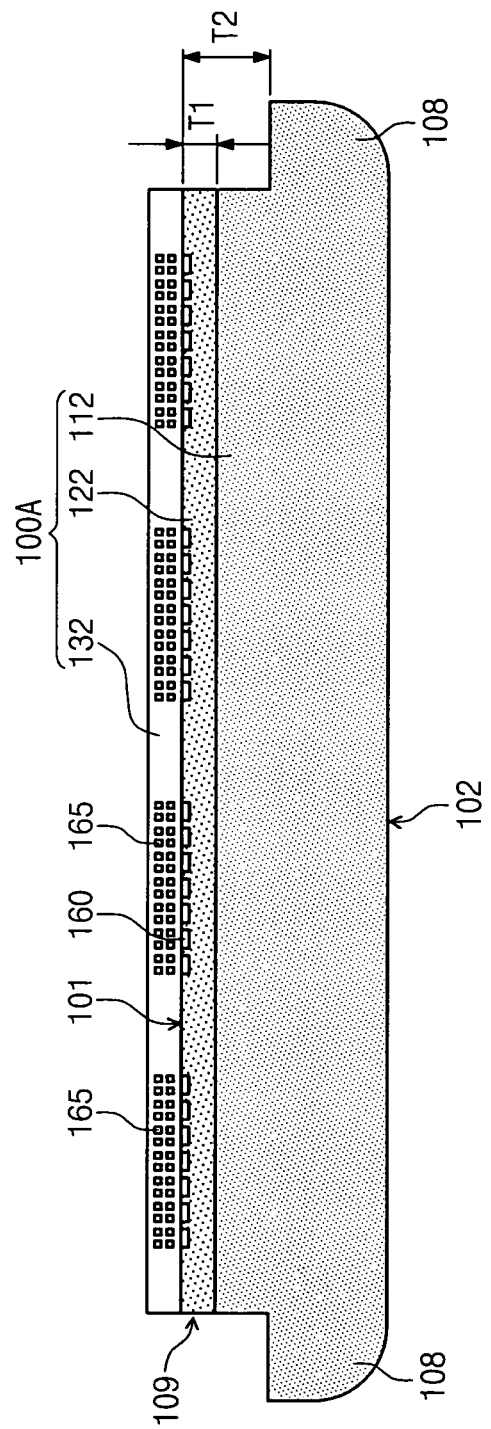

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments of the inventive concept will be described below in more detail with reference to the accompanying drawings. Example embodiments of the inventive concept may, however, be embodied in different forms and should not be construed as limited to the embodiments set forth herein. Rather, these embodiments may be provided so that this disclosure will be thorough and complete, and will fully convey the scope of the inventive concept to those skilled in the art. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1E are cross section views illustrating a method of manufacturing a semiconductor device in accordance with an example embodiment of the inventive concept. Referring to FIG. 1A, a first substrate 100 on which a sacrificial layer 110, an active region 120 and an interconnection layer 130 are sequentially stacked is provided.

The sacrificial layer 110 may be a silicon substrate. The active layer 120 is disposed on the sacrificial layer 110. The active layer 120 may include single crystalline silicon formed using an epitaxial technique. The sacrificial layer 110 and the active layer 120 may include a level portion 104 and an edge portion 106. The level portion 104 may be connected to the edge portion 106. The level portion 104 may include a first surface 101 and a second surface 102 facing each other. The first surface 101 may be defined as a front surface and the second surface 102 may be defined as a rear surface. The edge portion 106 may be a bevel portion. The active layer 120 may have a first depth (T1) vertically formed from the first surface 101. The active layer 120 may include the first surface 101 and an image sensor circuit portion 160 formed in the first depth (T1). The image sensor circuit portion 160 may include a photodetector (e.g., a photodiode) and a transistor electrically connected to the photodetector.

The interconnection layer 130 may cover the active layer 120. The interconnection layer 130 may be one of a silicon oxide layer, a silicon nitride layer, a silicon oxynitride layer and combinations thereof. The interconnection layer 130 may include an interconnection 165 formed in the inside thereof. The interconnection 165 may be electrically connected to the image sensor circuit portion 160.

Referring to FIG. 1B, an edge-trimming of the first substrate 100 may be performed to form an interconnection layer pattern 132, an active layer pattern 122 and a sacrificial layer pattern 112. Performing an edge-trimming process with respect to the first substrate 100 may include removing a portion of first substrate 100 by dry etching using one of an anisotropic etching, a laser beam and a blade.

For example, portions of edges of the interconnection 130, the active layer 120 and the sacrificial layer 110 may be removed by dry etching to form the interconnection layer pattern 132, the active layer pattern 122 and the sacrificial layer pattern 112. The interconnection layer pattern 132, the active layer pattern 122 and the sacrificial layer pattern 112 may include a surface 109 perpendicular to the first surface 101. The active layer pattern 122 and the sacrificial layer pattern 112 may constitute a portion of the surface 109 and may include a side having a second depth (T2) greater than the first depth (T1). The second depth (T2) may be 4 µm to 100 µm. The sacrificial layer pattern 112 may include a protrusive portion 108. The interconnection layer pattern 132 may include a level surface similar to the first surface 101. The interconnection pattern 132, the active layer pattern 122 and the sacrificial layer pattern 112 may be comprised of a first substrate 100A including the protrusive portion 108.

Referring to FIG. 1C, a second substrate 200 is provided. The second substrate 200 may be a silicon substrate. The first substrate 100A including the protrusive portion 108 may be adhered to the second substrate 200. The first surface 101 of the first substrate 100A may be adhered to the second substrate 200 under the condition that the interconnection layer pattern 132 is interposed between the first surface 101 and the second substrate 200. Accordingly, the first surface 101 faces the second substrate 200 and a second surface 102 of the first substrate 100A may be exposed. The level surface of the interconnection layer pattern 132 may be adhered to a level surface of the second substrate 200, so that the first substrate 100A may be fixedly adhered to the second substrate 200. The adhesion process may include an annealing process.

Figure 1D:
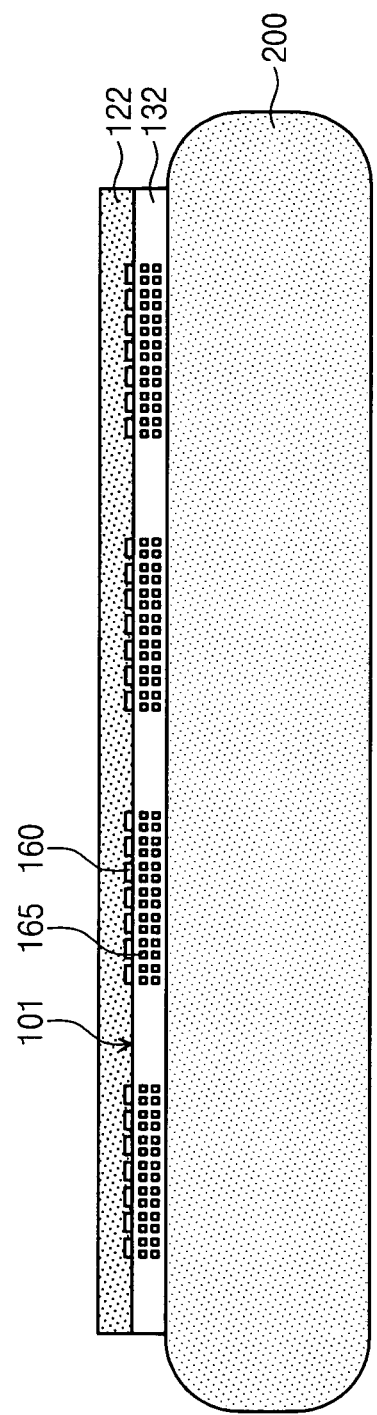

Referring to FIG. 1D, the sacrificial layer pattern 112 is removed to expose the active layer pattern 122. For example, the second surface 102 of the first substrate 100A is polished to remove the sacrificial layer pattern 112. A method of removing the sacrificial layer pattern 112 is not limited to the aforementioned method but may be embodied by various methods (e.g., an etching method or a physical separation method). Thus, the protrusive portion 108 may be removed. Consequently, the edge portion 106 (e.g., bevel portion) of the sacrificial layer pattern 110 and the active layer 120 is removed. According to an example embodiment of the inventive concept, the bevel portion whose backside is polished may be removed without applying a physical force thereto, so that damage to an edge of the active layer pattern 122 may be prevented or reduced. Moreover, particles due to a mechanical removal of the bevel portion are not generated, so that damage to a manufacturing apparatus (not shown) of a semiconductor device and damage to a level surface of the active layer pattern 122 may be reduced in a subsequent process.

Referring to FIG. 1E, an insulating layer 140 including a color filter layer 167 may be formed on the exposed active layer pattern 122 and a microlens 168 may be formed on the insulating layer 140. The color filter layer 167 and the microlens 168 may constitute a transillumination portion layer 170. A light penetrates the transillumination portion layer 170 to provide light having a specific wavelength to a photodetector of the image sensor circuit portion 160.

The image sensor circuit portion 160 may be formed on the first surface 101 of the active layer pattern 122 and in the first depth (T1), the interconnection 165 may be formed under the first surface 101 and the transillumination portion layer 170 may be formed on the other surface 103 of the active layer pattern 122 to embody a backside illuminated CMOS image sensor 700. Since the backside illuminated CMOS image sensor 700 is formed using the active layer pattern 122 having little damage, there may be improved reliability and improved performance.

Figure 2A:
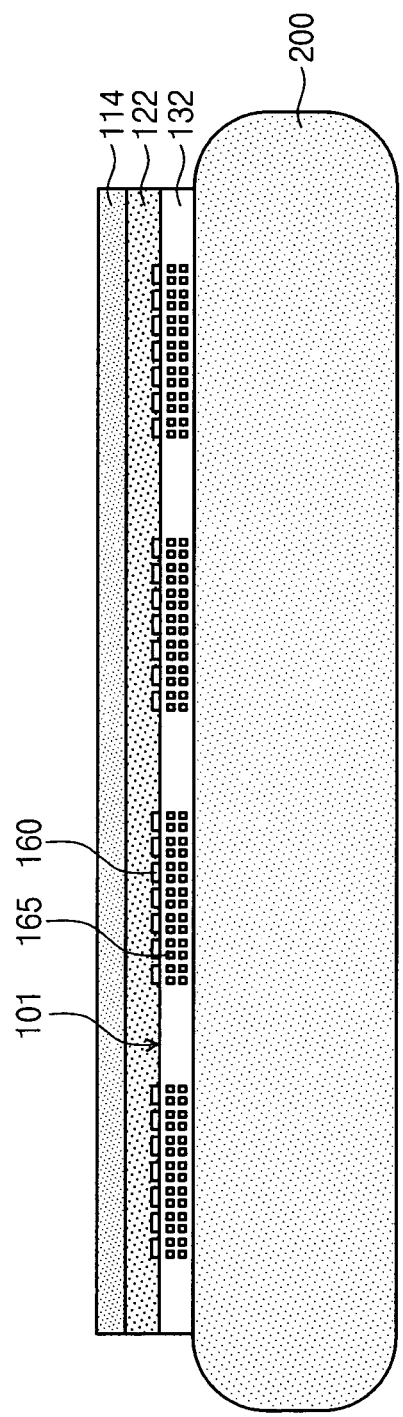
FIGS. 2A and 2B are cross section views illustrating a method of manufacturing a semiconductor device in accordance with an example embodiment of the inventive concept.
Figure 2B:
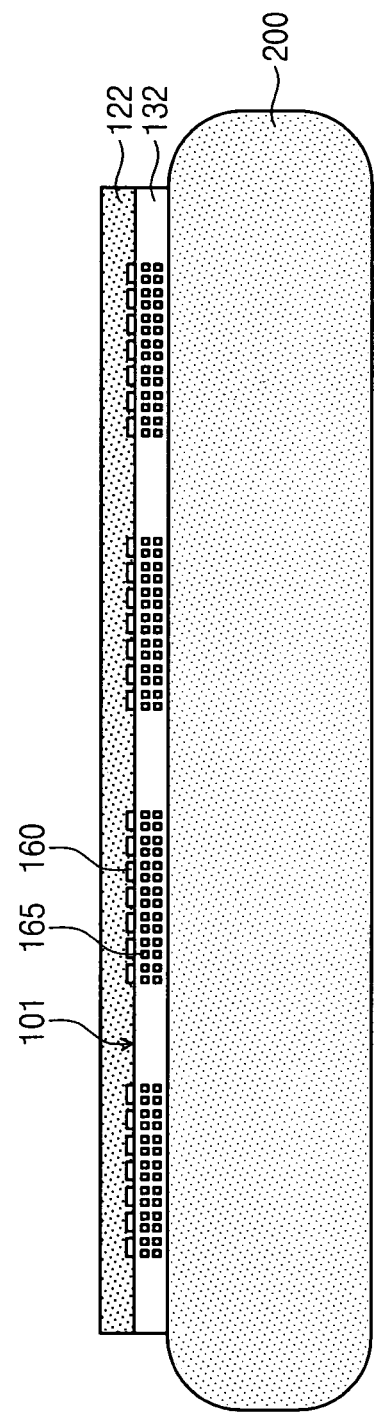

FIGS. 2A and 2B are cross section views illustrating a method of manufacturing a semiconductor device in accordance with an example embodiment of the inventive concept. The example embodiment illustrated in FIGS. 2A and 2B may be similar to the example embodiment illustrated in FIGS. 1A-1E. Descriptions of technical features of overlapped parts with the aforementioned example embodiment illustrated in FIGS. 2A and 2B may be roughly described or omitted for brevity of description.

Referring to FIG. 2A, after adhering the first substrate 100A including the protrusive portion 108 to the second substrate 200 using the method of FIGS. 1A through 1C, a portion of the sacrificial layer pattern 112 is polished to remove the protrusive portion 108. The polishing process may include removing the first substrate 100A until the active layer pattern 122 is exposed. Thus, the sacrificial layer pattern 114, the protrusive portion 108 of which is removed, may remain on the second substrate 200.

Referring to FIG. 2B, the polished sacrificial layer pattern 114 may be removed to expose the active layer pattern 122. For example, the sacrificial layer pattern 114 may be removed by a wet etching process. That is, the sacrificial layer pattern 114 may have an etching selectivity with respect to the active layer pattern 122, the interconnection layer pattern 132 and the second substrate 200. For example, the sacrificial layer pattern 114 may include a p-type impurity doped with a first concentration. The active layer pattern 122 may include a p-type impurity doped with a second concentration lower than the first concentration. The second substrate 200 may include a p-type impurity doped with a concentration equal to or similar to the second concentration. The wet etching process may be performed using an etching solution including at least one of hydrofluoric acid, a nitric acid and an acetic acid. According to an example embodiment of the inventive concept, a more uniform exposed surface of the active layer pattern 122 may be obtained through the wet etching process.

FIGS. 3A through 3E are cross sectional views illustrating a method of manufacturing a semiconductor device in accordance with an example embodiment of the inventive concept. The example embodiment illustrated in FIGS. 3A-3E may be similar to the example embodiment illustrated in FIGS. 1A-1E or the example embodiment illustrated in FIGS. 2A and 2B. Descriptions of technical features of overlapped parts with the aforementioned example embodiment illustrated in FIGS. 1A-1E or the example embodiment illustrated in FIGS. 2A and 2B may be roughly described or omitted for brevity of description.

Figure 3A:
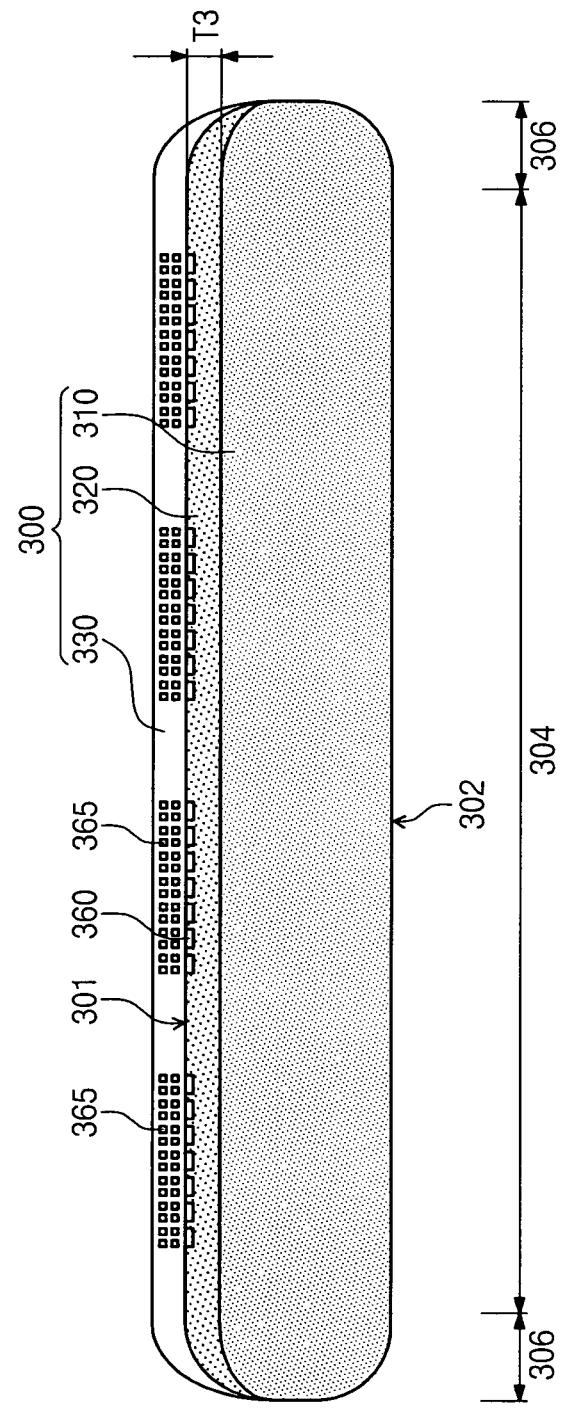
FIGS. 3A through 3E are cross section views illustrating a method of manufacturing a semiconductor device in accordance with an example embodiment of the inventive concept.

Referring to FIG. 3A, a first substrate 300 on which a sacrificial layer 310, an active layer 320 and an interconnection layer 330 are sequentially stacked is provided. The sacrificial layer 310 may be a silicon substrate doped with a p-type impurity of a first concentration. The active layer 320 may include a single crystalline silicon formed using an epitaxial technique. The active layer 320 may be a silicon substrate doped with a p-type impurity of a second concentration lower than the first concentration. The sacrificial layer 310 and the active layer 320 may include a level portion 304 and an edge portion 306. The level portion 304 may be connected to the edge portion 306. The level portion 304 may include a first surface 301 and a second surface 302 facing each other. The edge portion 306 may be a bevel portion. The active layer 320 may have a first depth (T3) vertically formed from the first surface 301. The active layer 320 may include the first surface 301 and an image sensor circuit portion 360 formed in the first depth (T3). The image sensor circuit portion 360 may include a photodetector (e.g., a photodiode) and a transistor electrically connected to the photodetector.

The interconnection layer 330 may cover the active layer 320. The interconnection layer 330 may include an interconnection 365 formed in the inside thereof. The interconnection 365 may be electrically connected to the image sensor circuit portion 360.

Figure 3B:
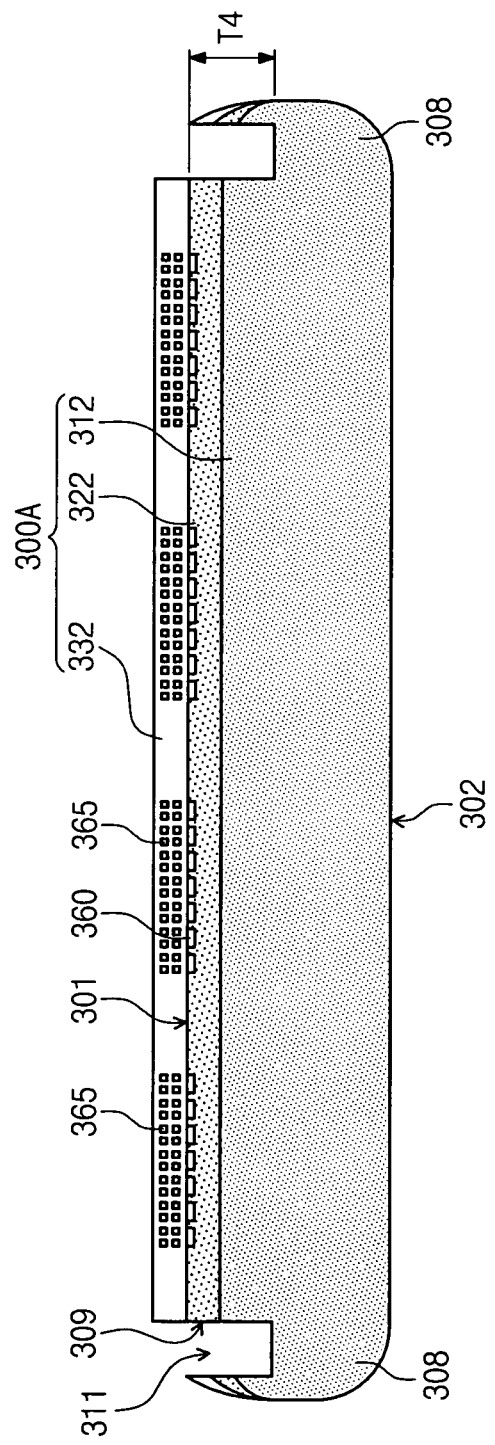

Referring to FIG. 3B, an edge-trimming of the third substrate 300 may be performed to form an interconnection layer pattern 332, an active layer pattern 322 and a sacrificial layer pattern 312. Performing an edge-trimming process with respect to the third substrate 300 may include removing a portion of the third substrate 300 by dry etching using one of an anisotropic etching, a laser beam and a blade.

For example, portions of edges of the interconnection 330, the active layer 320 and the sacrificial layer 310 may be removed by dry etching to form the interconnection layer pattern 332, the active layer pattern 322 and the sacrificial layer pattern 312. The interconnection layer pattern 332, the active layer pattern 322 and the sacrificial layer pattern 312 may include a surface 309 perpendicular to the first surface 301. The active layer pattern 322 and the sacrificial layer pattern 312 may constitute a portion of the surface 309 and may include a side having a second depth (T4) greater than the first depth (T3). The interconnection layer pattern 332 may include a level surface similar to the first surface 301. The interconnection pattern 332, the active layer pattern 322 and the sacrificial layer pattern 312 may be comprised of a third substrate 300A including the protrusive portion 308. According to an example embodiment of the inventive concept, a groove 311 including the surface 309 perpendicular to the third substrate 300 may be provided.

Figure 3C:
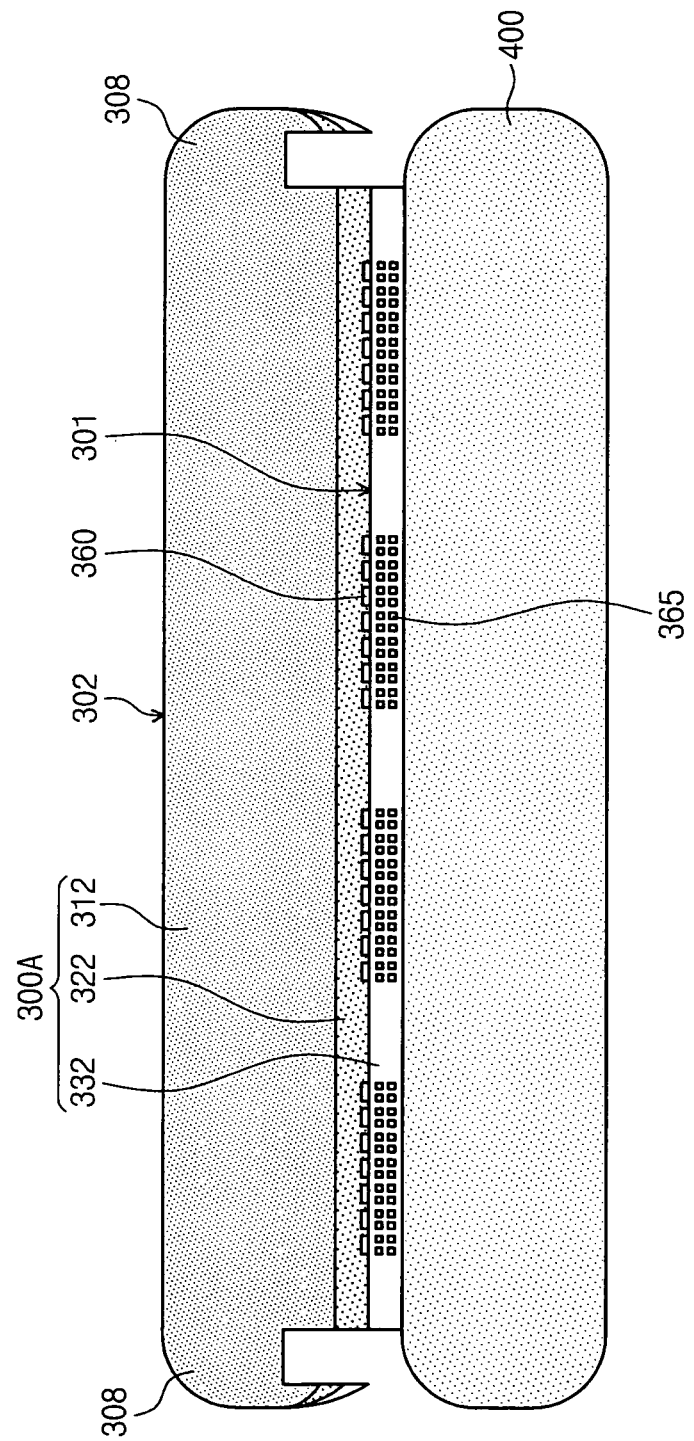

Referring to FIG. 3C, a second substrate 400 is provided. The second substrate 400 may be a silicon substrate doped with a p-type impurity of a concentration equal to or similar to the second concentration. The third substrate 300A including the protrusive portion 308 is adhered to the second substrate 400. The first surface 301 of the third substrate 300A may be adhered to the second substrate 400 under the condition that the interconnection layer pattern 332 is interposed between the first surface 301 and the second substrate 400. A second surface 302 of the third substrate 300A is exposed. The level surface of the interconnection layer pattern 332 is adhered to a level surface of the second substrate 400, so that the third substrate 300A may be fixedly adhered to the second substrate 400. The adhesion process may include an annealing process.

Figure 3D:
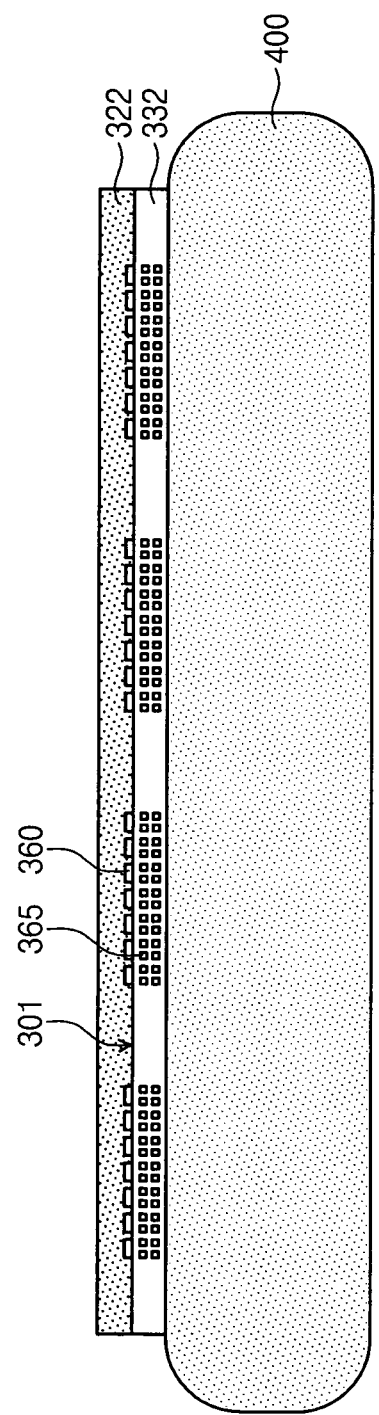

Referring to FIG. 3D, the sacrificial layer pattern 312 is removed to expose the active layer pattern 322. The removing process may include a chemical mechanical process. The polishing process may be performed until the protrusive portion 308 is removed and the active layer pattern 322 is exposed. Consequently, the edge portion 306 (e.g., bevel portion) of the sacrificial layer pattern 310 and the active layer 320 is removed.

As an alternative, after a polishing process is performed using the method of FIGS. 2A and 2B, a wet etching process may be performed to expose the active layer pattern 322. As another alternative, the sacrificial layer pattern 312 may be removed using a physical separation method to expose the active layer pattern 322.

Figure 3E:
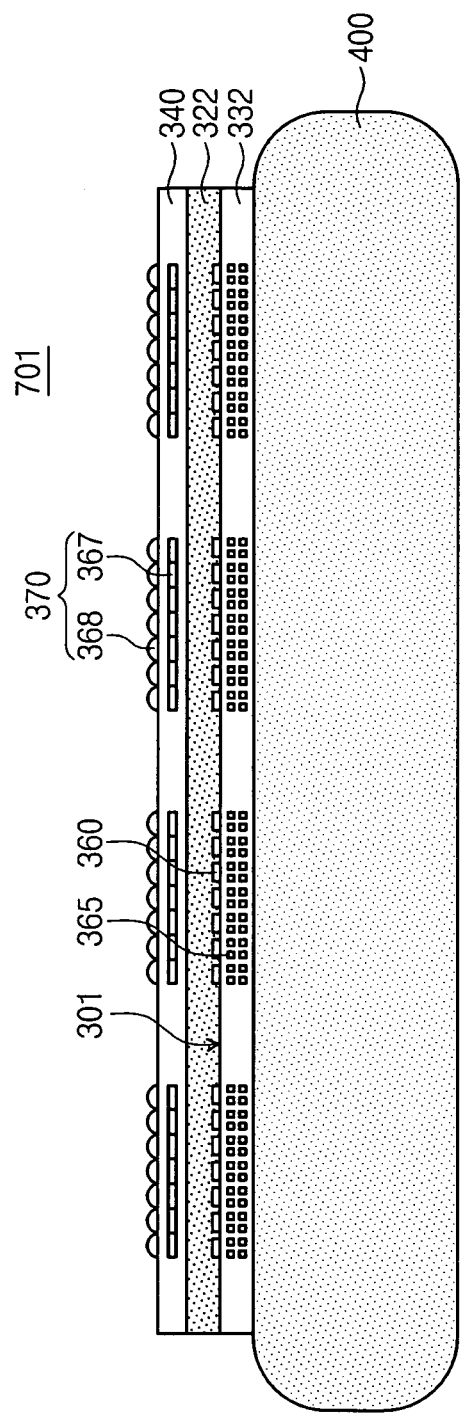

Referring to FIG. 3E, an insulating layer 340 including a color filter layer 367 may be formed on the exposed active layer pattern 322 and a microlens 368 may be formed on the insulating layer 340. The color filter layer 367 and the microlens 368 may constitute a transillumination portion layer 370. That is, a backside illuminated CMOS image sensor 701 including the image sensor circuit portion 360, the interconnection 365 and the transillumination portion layer 370 may be embodied.

FIGS. 4A through 4D are cross sectional views illustrating a method of manufacturing a semiconductor device in accordance with an example embodiment of the inventive concept. The example embodiment illustrated in FIGS. 4A-4D may be similar to the example embodiment illustrated in FIGS. 1A-1E, the example embodiment illustrated in FIGS. 2A and 2B or the example embodiment illustrated in FIGS. 3A-3E. Descriptions of technical features of overlapped parts with the aforementioned example embodiment illustrated in FIGS. 1A-1E, the example embodiment illustrated in FIGS. 2A and 2B or the example embodiment illustrated in FIGS. 3A-3E may be roughly described or omitted for brevity of description.

Referring to FIG. 4A, a first substrate 500 on which a sacrificial layer 510, an active layer 520 and an interconnection layer 530 are sequentially stacked is provided. The sacrificial layer 510 may be a silicon substrate doped with a p-type impurity of a first concentration. The active layer 520 may include a single crystalline silicon formed using an epitaxial technique. The active layer 520 may be a silicon substrate doped with a p-type impurity of a second concentration lower than the first concentration. The sacrificial layer 510 and the active layer 520 may include a level portion 504 and an edge portion 506. The level portion 504 may be connected to the edge portion 506. The level portion 504 may include a first surface 501 and a second surface 502 facing each other. The edge portion 506 may be a bevel portion.

The active layer 520 may have a first depth (T5) vertically formed from the first surface 501. The active layer 520 may include the first surface 501 and an image sensor circuit portion 560 formed in the first depth (T5). The image sensor circuit portion 560 may include a photodetector (e.g., a photodiode) and a transistor electrically connected to the photodetector. The interconnection layer 530 may be under the active layer 520. The interconnection layer 530 may include an interconnection 565 formed in the inside thereof. The interconnection 565 may be electrically connected to the image sensor circuit portion 560.

A second substrate 600 is provided. The second substrate 600 may be a silicon substrate doped with a p-type impurity of a concentration equal to or similar to the second concentration. The first substrate 500 is adhered to the second substrate 600. The first surface 501 of the first substrate 500 may be adhered to the second substrate 600 under the condition that the interconnection layer 530 is interposed between the first surface 501 and the second substrate 600.

Figure 4B:
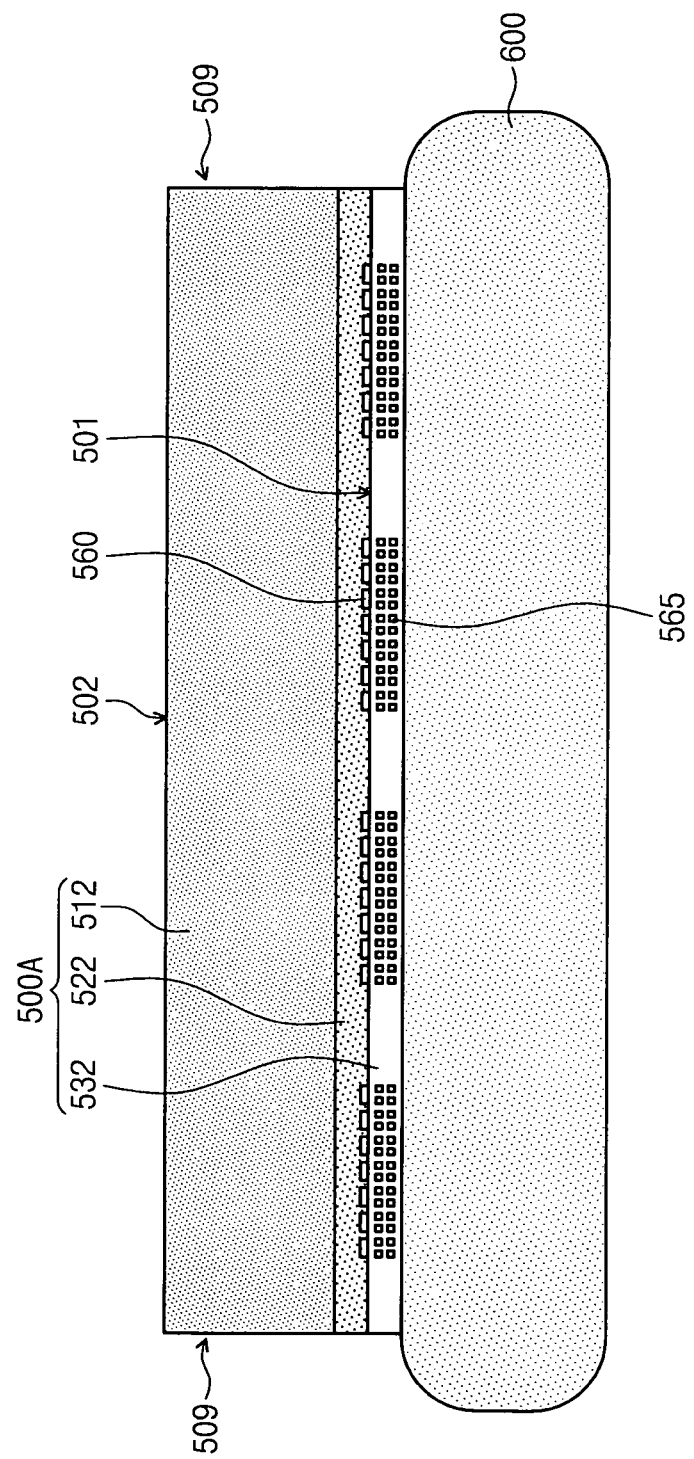

Referring to FIG. 4B, an edge-trimming of the first substrate 500 is performed to form an interconnection layer pattern 532, an active layer pattern 522 and a sacrificial layer pattern 512. Performing edge-trimming of the first substrate 500 may include removing a portion of first substrate 500 by dry etching using one of an anisotropic etching, a laser beam and a blade.

For example, portions of edges of the interconnection 530, the active layer 520 and the sacrificial layer 510 may be removed by dry etching to form the interconnection layer pattern 532, the active layer pattern 522 and the sacrificial layer pattern 512. The interconnection layer pattern 532, the active layer pattern 522 and the sacrificial layer pattern 512 may include a surface 509 perpendicular to the first surface 501. The interconnection layer pattern 532 may include a level surface similar to the first surface 501. The interconnection pattern 532, the active layer pattern 522 and the sacrificial layer pattern 512 may be comprised of a third substrate 500A including the surface 509 perpendicular to the first surface 501.

According to an example embodiment of the inventive concept, before a polishing process which will be subsequently performed, the edge portion 506 (e.g., bevel portion) of the sacrificial layer 510 and the active layer 520 may be removed.

Referring to FIG. 4C, the sacrificial layer pattern 512 is removed to expose the active layer pattern 522. The removing process may include a chemical mechanical process. For example, the second surface 502 of the third substrate 500A may be polished to remove the sacrificial layer pattern 512.

As an alternative, after a polishing process is performed using the method of FIGS. 2A and 2B, a wet etching process may be performed to expose the active layer pattern 522. As another alternative, the sacrificial layer pattern 512 may be removed using a physical separation method to expose the active layer pattern 522.

Figure 4D:
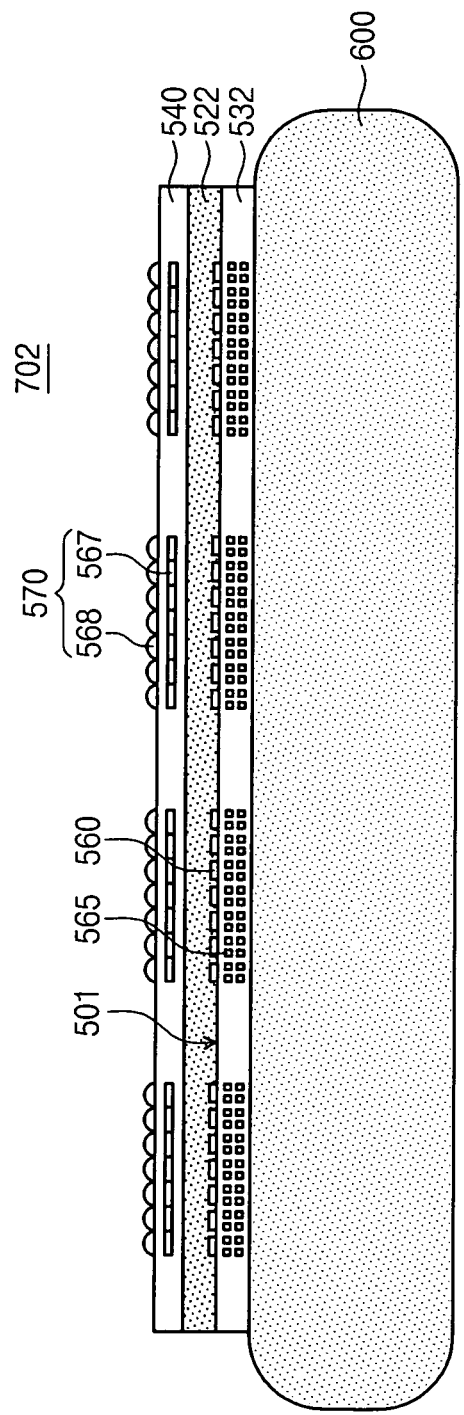

Referring to FIG. 4D, an insulating layer 540 including a color filter layer 567 may be formed on the exposed active layer pattern 522 and a microlens 568 may be formed on the insulating layer 540. The color filter layer 567 and the microlens 568 may constitute a transillumination portion layer 570. That is, a backside illuminated CMOS image sensor 702 including the image sensor circuit portion 560, the interconnection 365 and the transillumination portion layer 570 may be embodied.

Figure 5:
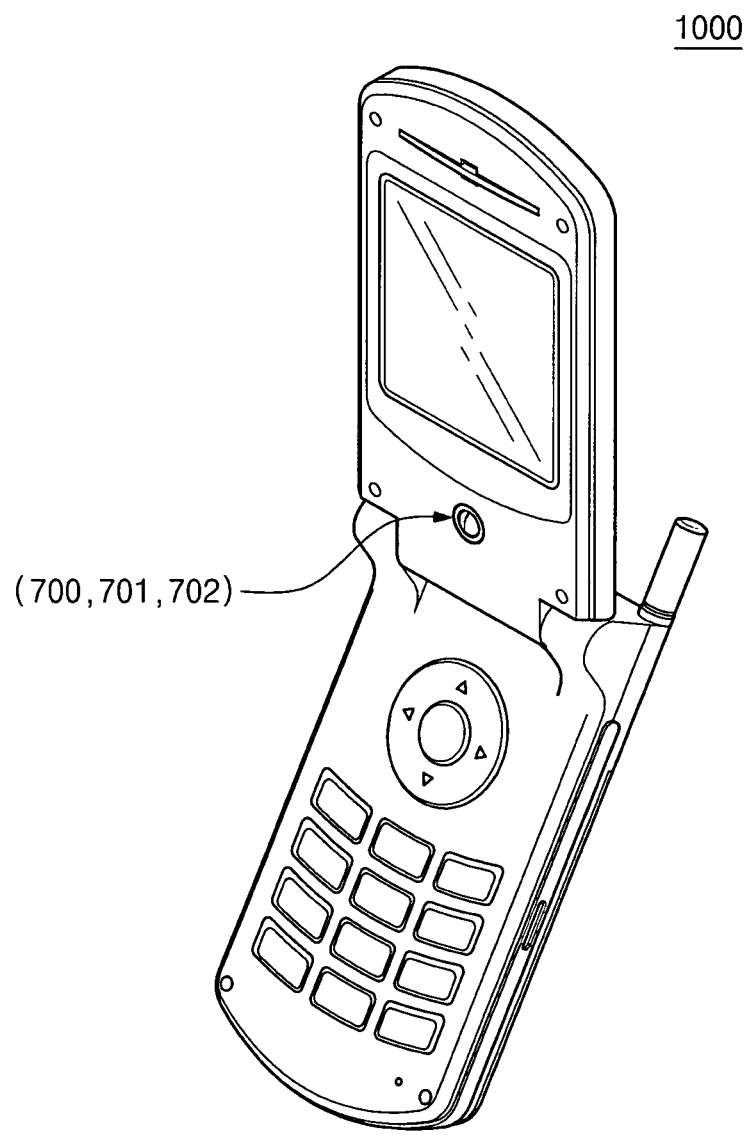

FIG. 5 is a perspective view illustrating an electronic device including a semiconductor device in accordance with an example embodiment of the inventive concept. Referring to FIG. 5, an electronic device 1000 (700, 701, 702) in accordance with an example embodiment of the inventive concept may be a mobile phone. The electronic device 1000 may include the backside illuminated CMOS image sensor having improved reliability and performance in accordance with an example embodiment of the inventive concept.

The backside illuminated CMOS image sensor may be included in various types of electronic devices such as a camera, a camcorder, a personal digital assistant (PDA), a wireless phone, a laptop computer, an optical mouse, a facsimile and a copying machine. Also, the backside illuminated CMOS image sensor may be included in devices such as a telescope, a mobile phone hand set, a scanner, an endoscope, a fingerprint recognition device, a toy, games, a home robot and a car.

According to example embodiments of the inventive concept, damage to an edge of an active pattern may be prevented or reduced. In the subsequent process, damage to a manufacturing apparatus of a semiconductor device and damage to an active pattern may be reduced. Thus, a backside illuminated CMOS image sensor having improved reliability and performance may be provided.

The above-disclosed subject matter is to be considered illustrative, and not restrictive, and the appended claims are intended to cover all such modifications, enhancements, and other example embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a semiconductor device comprising:
   providing a first substrate, the first substrate including a sacrificial layer, an active layer having an image sensor circuit portion and an interconnection layer electrically connected to the image sensor circuit portion sequentially stacked,
      the interconnection layer including at least one interconnection inside;
   performing an edge-trimming process with respect to the first substrate to form an interconnection layer pattern, an active layer pattern and a sacrificial layer pattern by,
   sequentially performing a dry etching process with respect to an edge of the interconnection layer and an edge of the active layer to form the interconnection layer pattern and the active layer pattern, and
   performing a dry etching process with respect to a portion of an edge of the sacrificial layer to form the sacrificial layer pattern;
   adhering the first substrate to a second substrate after performing the edge-trimming process;
   removing the sacrificial layer pattern to expose the active layer pattern; and
   forming a transillumination layer on the active layer pattern such that the active layer pattern is disposed between the transillumination layer and the interconnection layer pattern, the transillumination layer configured to transmit light to the image sensor circuit portion.

2. The method of claim 1, wherein adhering the first substrate to the second substrate comprises adhering the interconnection layer pattern to the second substrate.

3. The method of claim 1, wherein performing the edge-trimming process with respect to the first substrate comprises removing a portion of the first substrate by dry etching using one of an anisotropic etching, a laser beam and a blade.

4. The method of claim 1, wherein removing the sacrificial layer pattern comprises polishing an entire portion of the sacrificial layer pattern until the active layer pattern is exposed.

5. The method of claim 1, wherein removing the sacrificial layer pattern comprises polishing a portion of the sacrificial layer pattern, and performing a wet etching process with respect to the other portion of sacrificial layer pattern until the active layer pattern is exposed.

6. The method of claim 1, wherein forming the transillumination layer comprises:
   forming a color filter layer on the active layer pattern: and
   forming a microlens on the color filter layer.

7. The method of claim 1, wherein the sacrificial layer is a silicon substrate.

8. The method of claim 1, further comprising:
   forming the active layer on the sacrificial layer, the active layer made of single crystalline silicon using an epitaxial technique.

9. The method of claim 1, further comprising:
   forming the active layer on the sacrificial layer, the active layer and the sacrificial layer including a level portion and an edge portion connected to the level portion, the level portion including a first surface and a second surface facing each other.

10. The method of claim 9, further comprising:
    forming the active layer on the sacrificial layer, the active layer having a first depth in a vertical direction from the first surface; and
    forming an image sensor circuit portion in the first depth.

11. The method of claim 10, wherein forming the image sensor circuit portion in the first depth further comprises electrically connecting a transistor to a photodetector.

12. The method of claim 10, further comprising:
electrically connecting the interconnection to the image sensor circuit portion.

13. The method of claim 9, wherein the interconnection layer pattern, the active layer pattern and the sacrificial layer pattern include a third surface perpendicular to the first surface.

14. A method of manufacturing a semiconductor device comprising:
providing a first substrate, the first substrate including a sacrificial layer, an active layer having an image sensor circuit portion and an interconnection layer electrically connected to the image sensor circuit portion sequentially stacked,
the interconnection layer including at least one interconnection inside;
performing an edge-trimming process with respect to the first substrate to form an interconnection layer pattern, an active layer pattern and a sacrificial layer pattern;
adhering the first substrate to a second substrate;
removing the sacrificial layer pattern to expose the active layer pattern; and
forming a transillumination layer on the active layer pattern such that the active layer pattern is disposed between the transillumination layer and the interconnection layer pattern, the transillumination layer configured to transmit light to the image sensor circuit portion, wherein
the edge-trimming process is performed after adhering the first substrate to the second substrate,
the adhering the first substrate to the second substrate comprises adhering the interconnection layer to the second substrate, and
the performing the edge-trimming process with respect to the first substrate further includes,
removing an edge of the sacrificial layer by dry etching to form the sacrificial layer pattern, and
sequentially removing an edge of the active layer and an edge of the interconnection layer by the dry etching to form the active layer pattern and the interconnection layer pattern.

15. A method of manufacturing a semiconductor device comprising:
forming an active layer on a first substrate, the active layer including a photodetector;
forming an interconnection layer on the active layer, the interconnection layer electrically connected to the photodetector;
adhering the interconnection layer to a second substrate;
removing the first substrate to expose a surface of the active layer;
performing an edge-trimming process that includes,
removing an edge portion of the interconnection layer to form an interconnection layer pattern, and
removing an edge portion of the active layer to form an active layer pattern;
forming a transillumination layer on an exposed surface of the active layer pattern such that the active layer pattern is disposed between the transillumination layer and the interconnection layer pattern, the transillumination layer configured to transmit light to the photodetector.

* * * * *